(12) United States Patent
Moert

(10) Patent No.: US 8,828,869 B1
(45) Date of Patent: Sep. 9, 2014

(54) METHODS OF FORMING MASKING LAYERS FOR USE IN FORMING INTEGRATED CIRCUIT PRODUCTS

(71) Applicant: GLOBALFOUNDRIES Inc., Grand Cayman (KY)

(72) Inventor: Manfred Heinrich Moert, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 13/852,043

(22) Filed: Mar. 28, 2013

(51) Int. Cl.
*H01L 21/44* (2006.01)
*H01L 21/768* (2006.01)

(52) U.S. Cl.
CPC ....... *H01L 21/76871* (2013.01); *Y10S 977/811* (2013.01)
USPC ............................ 438/685; 438/705; 977/811

(58) Field of Classification Search
USPC ........... 438/656, 685, 705; 977/810–812, 831
See application file for complete search history.

(56) References Cited

U.S. PATENT DOCUMENTS

| | | | | |
|---|---|---|---|---|
| 7,138,013 B2 * | 11/2006 | Natori et al. | ................. | 438/685 |
| 7,368,823 B1 * | 5/2008 | Horibe et al. | ................. | 257/764 |
| 7,790,469 B2 * | 9/2010 | Wang et al. | ................. | 436/165 |
| 2002/0086511 A1 | 7/2002 | Hartner et al. | | |
| 2003/0068846 A1 | 4/2003 | Moise et al. | | |
| 2004/0245209 A1 | 12/2004 | Jung et al. | | |
| 2010/0284125 A1 * | 11/2010 | Moon et al. | ................... | 361/305 |
| 2011/0076827 A1 | 3/2011 | Liu et al. | | |
| 2011/0100955 A1 | 5/2011 | Pushparaj et al. | | |
| 2012/0161212 A1 | 6/2012 | Cohen et al. | | |
| 2013/0011736 A1 | 1/2013 | Loveness et al. | | |
| 2013/0021605 A1 | 1/2013 | Yi et al. | | |
| 2013/0153819 A1 | 6/2013 | Tseng et al. | | |

* cited by examiner

*Primary Examiner* — Fernando L Toledo
*Assistant Examiner* — Bryan Junge
(74) *Attorney, Agent, or Firm* — Amerson Law Firm, PLLC

(57) ABSTRACT

One illustrative method disclosed herein includes forming a seed layer above a structure, forming a nucleation layer on the seed layer, forming a plurality of spaced-apart, vertically oriented alloy structures that are comprised of materials from the seed layer and the nucleation layer, forming a sacrificial material layer above the nucleation layer and around the alloy structures, performing an etching process to remove the alloy structures and portions of the seed layer so as to thereby define a plurality of openings, forming an initial masking structure in each of the openings, performing an etching process to remove the sacrificial material layer and the nucleation layer so as to thereby expose the structure and define a masking layer comprised of the initial masking structures, and performing at least one process operation on the structure through the masking layer.

27 Claims, 7 Drawing Sheets

METHODS OF FORMING MASKING LAYERS FOR USE IN FORMING INTEGRATED CIRCUIT PRODUCTS

BACKGROUND OF THE INVENTION

1. Field of the Invention

Generally, the present disclosure relates to the manufacture of sophisticated semiconductor devices, and, more specifically, to various methods of forming masking layers for use in forming integrated circuit products.

2. Description of the Related Art

The fabrication of advanced integrated circuits, such as CPUs, storage devices, ASICs (application specific integrated circuits) and the like, requires a large number of circuit elements, such as transistors, capacitors, resistors, etc., to be formed on a given chip area according to a specified circuit layout. During the fabrication of complex integrated circuits using, for instance, MOS (Metal-Oxide-Semiconductor) technology, millions of transistors, e.g., N-channel transistors (NFETs) and/or P-channel transistors (PFETs), are formed on a substrate including a crystalline semiconductor layer. A field effect transistor, irrespective of whether an NFET transistor or a PFET transistor is considered, typically includes doped source and drain regions that are formed in a semiconducting substrate and separated by a channel region. A gate insulation layer is positioned above the channel region and a conductive gate electrode is positioned above the gate insulation layer. By applying an appropriate voltage to the gate electrode, the channel region becomes conductive and current is allowed to flow from the source region to the drain region.

Fabricating such circuit elements involves forming various "features" or "structures" of the devices, such as gate electrode structures, metal lines, conductive contacts, etc. Each of these features has a so-called "critical dimension," which is typically the smallest size of a particular feature, e.g., the width of a line. As another example, for transistor devices, the critical dimension is gate length, which approximately corresponds to the width of the gate electrode that is positioned above the channel region of the device. Historically, such features and structures are typically formed by depositing a layer of material, forming a patterned photoresist mask layer above the layer of material and thereafter performing an etching process on the layer of material through the patterned photoresist mask layer, wherein the remaining portion of the layer of material after the etching process is the desired feature or structure. In other cases, a trench may be formed in a layer of material by performing an etching process through a patterned photoresist mask layer and thereafter a desired feature, e.g., a metal line, may be formed in the trench. The deposition, masking and etching techniques are performed using a variety of known deposition, etching and photolithography tools and techniques.

As should be clear from the foregoing, photolithography is one of the basic processes used in manufacturing integrated circuit products. At a very high level, photolithography involves (1) forming a layer of light or radiation-sensitive material, such as photoresist, above a layer of material or a substrate, (2) selectively exposing the radiation-sensitive material to a light generated by a light source (such as a DUV or EUV source) to transfer a pattern defined by a mask or reticle (interchangeable terms) to the radiation-sensitive material, and (3) developing the exposed layer of radiation-sensitive material to define a patterned mask layer. In general, the illuminated regions of the layer of photoresist material are chemically activated. In the case of a so-called "positive" resist mask, the exposed regions of the layer of photoresist material are subsequently removed in the developing process. In the case of a so-called "negative" resist mask, the illuminated regions of the layer of photoresist material are not removed during the developing process. Various process operations, such as etching or ion implantation processes, may then be performed on the underlying layer of material or substrate through the patterned photoresist mask layer.

Over the recent years and continuing to present day, there has been a constant demand for electrical consumer devices with improved operating characteristics, such as operating speed, and for physically smaller devices. As a result, device designers have reduced the physical size of the various features that are used in manufacturing integrated circuit devices to increase their performance capability and to produce smaller devices with more functionality, e.g., cell phones. To be more specific, the gate length of current generation transistor devices has been reduced to about 25-30 nm, and further reductions are contemplated in the future. Of course, the ultimate goal in integrated circuit fabrication is to faithfully reproduce the original circuit design on the integrated circuit product. Historically, the feature sizes and pitches (spacing between features) employed in integrated circuit products were such that a desired pattern could be formed using a single patterned photoresist masking layer. However, in recent years, device dimensions and pitches have been reduced to the point where existing photolithography tools, e.g., 193 nm wavelength photolithography tools, cannot form single patterned mask layers with all of the features of the overall target pattern.

To overcome the limitations of current-day photolithography tools and techniques, the semiconductor manufacturing industry has developed and employed several so-called double patterning techniques to be able to manufacture devices with features sizes that are smaller than can be patterned using a single exposure photolithography process. Double patterning generally involves the formation and use of two separate patterned photoresist mask layers instead of one to form the desired feature. Using these techniques, the second mask must be accurately aligned with the first mask. Two examples of known double patterning techniques include a so-called LELE (Litho-Etch-Litho-Etch) process and an LFLE (Litho-Freeze-Litho-Etch) process. However, such double patterning techniques are expensive and add to processing complexity.

The present disclosure is directed to various methods of forming masking layers for use in forming integrated circuit products that may solve or at least reduce some of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming masking layers for use in forming integrated circuit products. One illustrative method disclosed herein includes forming a seed layer above a structure, e.g., a layer of material, wherein the seed layer is comprised of a metal-containing material, forming a nucleation layer on the seed layer, wherein the nucleation layer is comprised of a transition metal oxide ceramic material, performing at least one thermal treatment process at a temperature so as to generate a plurality of spaced-apart, vertically oriented alloy structures, wherein the alloy structures are comprised of at least one material from the seed layer and at least one material from the nucleation layer and, after forming the alloy structures, forming a sacrificial material layer above the nucleation layer and around the alloy structures. In this example, the method also includes the steps of performing at least one etching process to remove the alloy structures and portions of the seed layer so as to thereby define a plurality of openings, forming an initial masking structure in each of the openings, performing at least one etching process to remove the sacrificial material layer and the nucleation layer so as to thereby expose the structure and the initial masking structures, forming additional masking material selectively on the initial masking structures so as to thereby define a plurality of final masking structures, wherein the final masking structures define a masking layer, and performing at least one process operation on the structure through the masking layer.

Another illustrative method disclosed herein includes forming a seed layer above a structure, wherein the seed layer is comprised of a metal-containing material, forming a nucleation layer on the seed layer, wherein the nucleation layer is comprised of a transition metal oxide ceramic material, performing at least one thermal treatment process at a temperature so as to generate a plurality of spaced-apart, vertically oriented alloy structures, wherein the alloy structures are comprised of at least one material from the seed layer and at least one material from the nucleation layer and, after forming the alloy structures, forming a sacrificial material layer above the nucleation layer and around the alloy structures. In this example, the method further includes the steps of performing at least one etching process to remove the sacrificial material layer and the nucleation layer and to pattern the seed layer so as to thereby expose the alloy structures and portions of the structure, forming a spacer structure around each of the exposed alloy structures, forming a layer of masking material around the spacer structures, performing at least one etching process to remove the spacer structure, the alloy structure and the patterned seed layer so as to thereby define a masking layer comprised of a plurality of openings, and performing at least one process operation on the structure through the masking layer.

BRIEF DESCRIPTION OF THE DRAWINGS

The disclosure may be understood by reference to the following description taken in conjunction with the accompanying drawings, in which like reference numerals identify like elements, and in which.

Figure 1A:
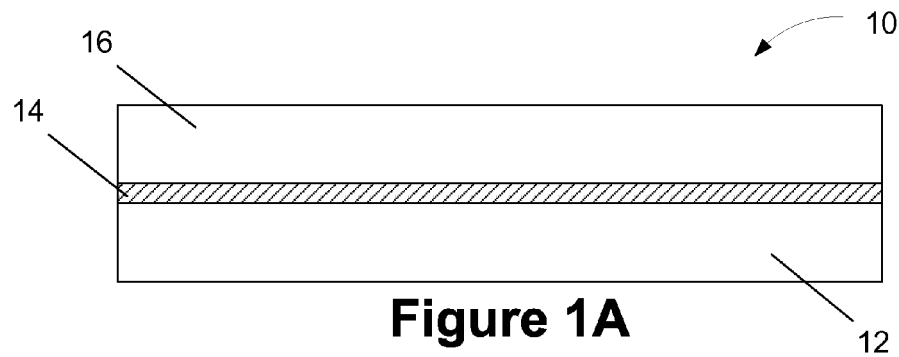
FIGS. 1A-1D depict various methods disclosed herein of forming alloy structures by performing a thermal treatment process.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods of forming masking layers, both positive and negative masking layers, for use in forming integrated circuit products. The masking layers disclosed herein may be employed for any purpose in the manufacture of integrated circuit products, e.g., the formation of a patterned hard mask, as used in etching or ion implantation processes, etc. Moreover, as will be readily apparent to those skilled in the art upon a complete reading of the present application, the methods disclosed herein may be used in manufacturing integrated circuit products that are fabricated using any of a variety of different technologies, e.g., NFET, PFET, CMOS, etc., and they may be employed in manufacturing a variety of different integrated circuit products, including, but not limited to, ASIC's, logic devices, memory devices, etc. With reference to the attached drawings, various illustrative embodiments of the methods disclosed herein will now be described in more detail.

FIGS. 1A-1D depict one illustrative example of forming a masking layer using the novel techniques disclosed herein. FIG. 1A depicts the masking layer 10 at an early stage of manufacture. The method begins with the formation of a seed layer 14 above a structure or layer of material 12. A nucleation layer 16 is formed above the seed layer 14. In some embodiments, an adhesion layer (not shown) may be formed between the structure or layer of material 12 and the seed layer 14. The various material layers shown in FIG. 1A may be comprised of different materials, they may be formed by performing a variety of known processing techniques, such as a chemical vapor deposition (CVD) process, an atomic layer deposition (ALD) process, physical vapor deposition (PVD), etc., and the thickness of such a layer(s) may vary depending upon the particular application. In one illustrative embodiment, the structure or layer of material 12 may be comprised of a hard mask material, such as silicon nitride, a low-k insulating material (k-value less than about 3.3) and it may have a thickness that falls within the range of about 30-800 nm. The structure or layer of material 12 may be positioned at any level or any location in an integrated circuit product. The seed layer 14 may be comprised of a metal-containing material such as, for example, platinum, copper, aluminum, etc. Depending upon the particular application, the seed layer 14 may have a thickness that falls within the range of about 5-200 nm. The nucleation layer 16 may be comprised of a transition metal oxide ceramic material such as, for example, a strontium, bismuth, tantalum, or niobium containing material (e.g., stoichiometric or non-stoichiometric $SrBi_2Ta_2O_9$ or $SrBi_2Nb_2O_9$, also called SBT or SBN or as a mixture of both SBTN). The thickness of the nucleation layer 16 may also vary depending upon the particular application, e.g., it may have a thickness that falls within the range of about 50-250 nm, and it may be deposited by performing single or multiple deposition/anneal steps.

Figure 1B:
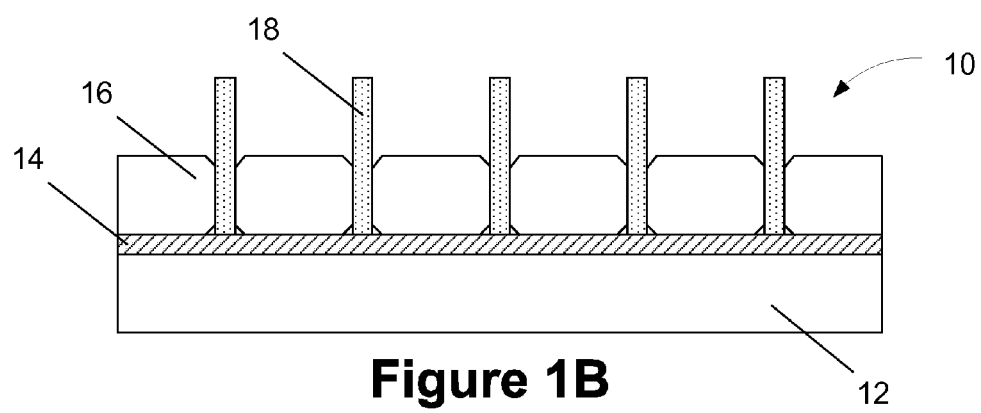
Figure 1C:
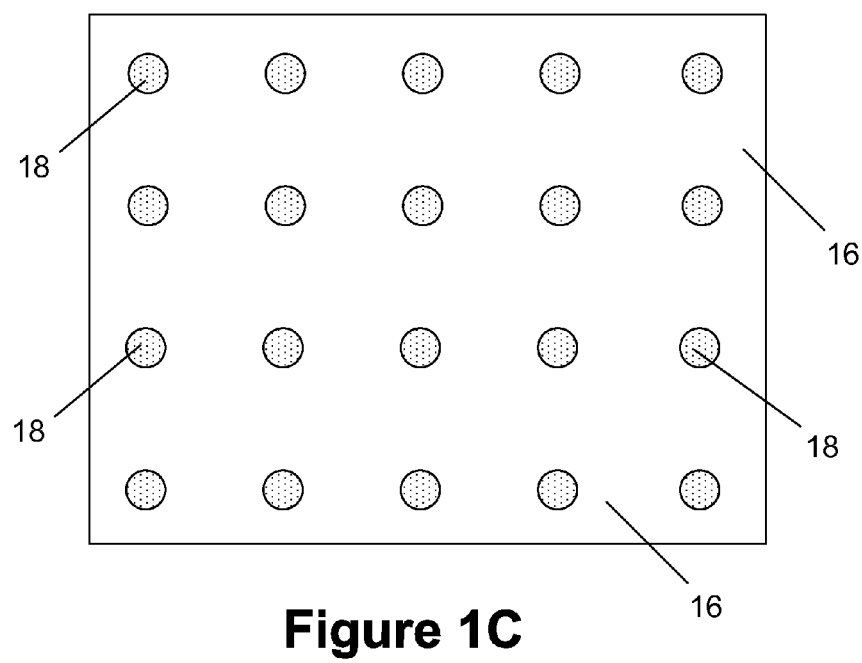
Figure 1D:
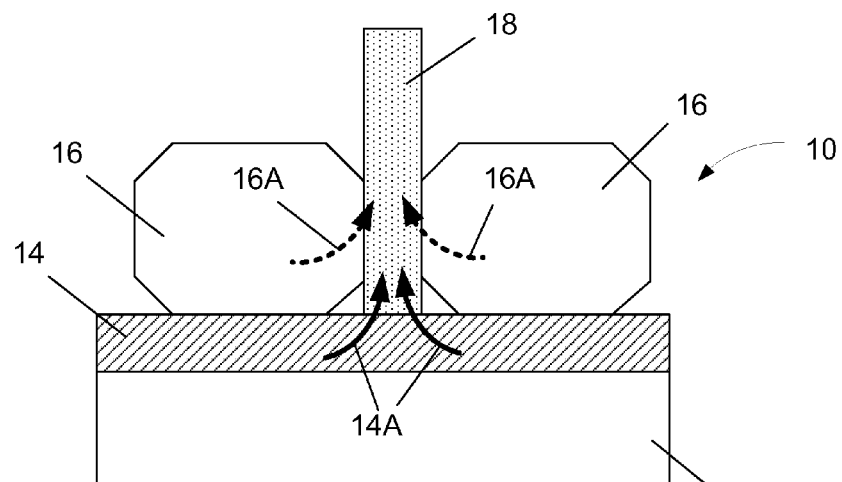

FIG. 1B depicts the masking layer 10 after at least one thermal treatment process has been performed. The thermal treatment process results in the formation of a plurality of alloy structures 18. In one illustrative example, the methods disclosed herein may be controlled such that the alloy structures 18 are formed in a periodic pattern, such as the illustrative periodic pattern of the alloy structures show in FIG. 1C. In one illustrative embodiment, the alloy structures 18 are cylindrical post-like column structures that have a diameter that falls within the range of about 20-200 nm, although the size and configuration of the alloy structures 18 may vary depending upon the particular application. Additionally, in the depicted example, the alloy structures 18 are formed to such a length that they extend above the upper surface of the nucleation layer 16, as shown in FIGS. 1B and 1D. In some applications, the alloy structures 18 may extend above the upper surface of the nucleation layer 16 by a distance of about 200-300 nm, although the length of the alloy structures 18 may vary depending upon the particular application. Stated another way, in one illustrative embodiment, the alloy structures 18 may have an axial length that falls within the range of about 250-500 nm. In the example depicted in FIG. 1C, the alloy structures 18 are formed in a square-type pattern such that each of the alloy structures 18 is approximately equally spaced from the immediately adjacent alloy structures 18.

FIG. 1D will be referenced to explain the manner in with the alloy structures 18 are formed. The above-mentioned thermal treatment process(es) may be performed in either a traditional furnace or an RTA (rapid thermal anneal) chamber. In one embodiment, a first thermal treatment process may be performed at a temperature that falls within the range of about 600-850° C. for a duration of about 20-120 minutes (in a furnace application) or about 120-600 seconds (in an RTA application) in an oxygen-containing ambient. In one example, an RTA process is initially performed to cause better nucleation of monocrystalline nuclei for later grain growth during a subsequent furnace anneal process. By changing RTA parameters, e.g., temperature ramp rate, the density of the nuclei of the layer may be defined. In one example, a second or subsequent thermal treatment process may be performed in a processing ambient comprised of forming gas (e.g., 95% $N_2$-5% $H_2$) or even a hydrogen-containing atmosphere, which reduces $Bi_xO_y$ layered material to elementary bismuth (Bi) especially at the grain boundaries and forms together with the platinum a conductive Pt—Bi alloy. As platinum has a catalytic influence on hydrogen, the reduction of bismuth is intensified, especially at the grain boundary regions of layer 16, and needle growth is accelerated. This latter thermal treatment process may be performed at a temperature that falls within the range of about 230-430° C. for a duration of 20-120 minutes in a furnace. The thermal treatment process(es) should be performed at a melting point above that of the metals involved but below the temperature at which reduction of the metal material occurs inside the grains so as to enable the formation of the alloy structure 18, instead of mere bumps. In general, with reference to FIG. 1D, during the at least one thermal treatment process, at least one first material from the seed layer 14 combines with at least one second material in the nucleation layer 16 to produce the alloy structure 18 that includes both of the first and second materials. These actions are reflected by the arrows 14A (first material(s)) and 16A (second material(s)). In a specific example where the seed layer 14 is comprised of platinum and the nucleation layer 16 is comprised of a bismuth-rich material, such as SrBi2Ta2O9 (stoichiometric or non-stoichiometric), or $Bi_xO_y$, platinum will diffuse from the seed layer 14 and combine with bismuth from the nucleation layer 16 to form an alloy structure 18 comprised of a bismuth-platinum alloy material.

As mentioned above, by controlling various parameters of the thermal treatment processes, such as thermal budget, ramp rate, temperature and/or duration, the pitch or pattern of the alloy structures 18 may be controlled. For example, the ramp rate used in the first thermal treatment process may range from 10-80° C./sec. In general, the greater the ramp rate, the more closely spaced will be the alloy structures 18, i.e., the greater the ramp rate, the greater the density of the alloy structures. Additionally, the higher the temperature of the thermal treatment process, the more SBT material is transformed from amorphous to crystalline material (closes the matrix). The longer the duration of the first thermal treatment process, the more SBT material is crystallized. The thickness of the layer 16 also influences the nucleation within a certain range of thickness: the thicker the layer 16, the more grain nuclei are formed and hence the denser is the matrix. However, at some point above a certain thickness (e.g., about 100 nm), this effect goes into a saturation. Additionally, above a certain temperature/time combination (thermal budget) of the thermal treatment process, the crystalline matrix is closed and grains could grow together. The thermal budget of the thermal treatment process could also influence the diameter of the resulting alloy structures 18. In general, the greater the thermal budget for the second forming gas anneal process, the taller and larger (diameter) will be the resulting alloy structures 18.

Figure 2A:
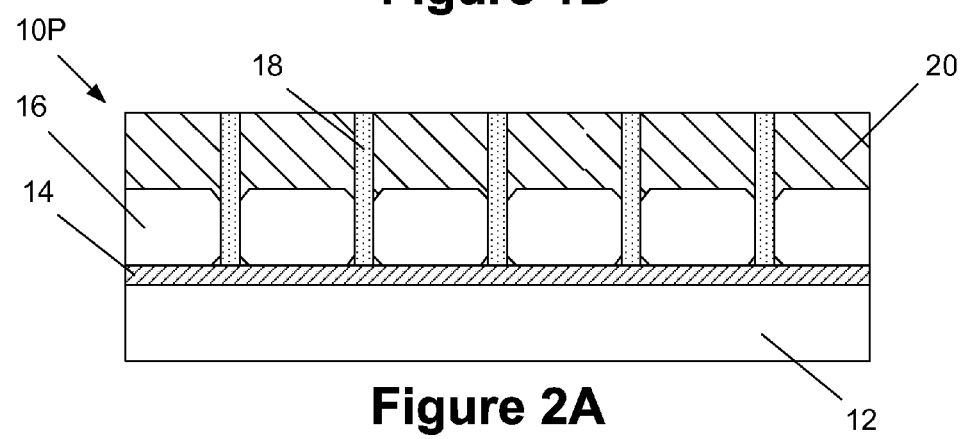
FIGS. 2A-2H depict one illustrative example wherein the methods disclosed herein may be employed to form a positive masking layer.

FIGS. 2A-2H depict one illustrative example wherein the methods disclosed herein may be employed to form a positive masking layer 10P for use in manufacturing an integrated circuit product. In FIG. 2A, a sacrificial layer of material 20 has been formed above the structure depicted in FIG. 1B, and a planarization process, such as a chemical mechanical planarization (CMP) process or an etch-back process, has been performed on the sacrificial layer of material 20 to arrive at the structure depicted in FIG. 2A. The sacrificial layer of material 20 may be comprised of a variety of materials such as, for example, silicon dioxide, silicon nitride, polysilicon or any other material that exhibits good etch selectivity relative to the alloy structures 18, and it may be formed using any traditional process, e.g., CVD, ALD, etc.

Figure 2B:
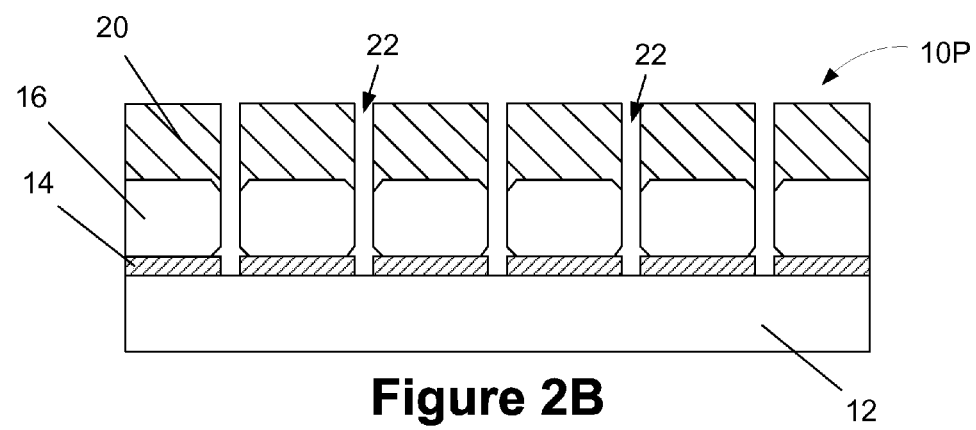

Next, as shown in FIG. 2B, one or more etching processes are performed to remove the alloy structures 18 and the underlying portions of the seed layer 14. In one example, the etching processes may be dry anisotropic etching processes. The etching process(es) results in the formation of a plurality of openings 22.

Figure 2C:
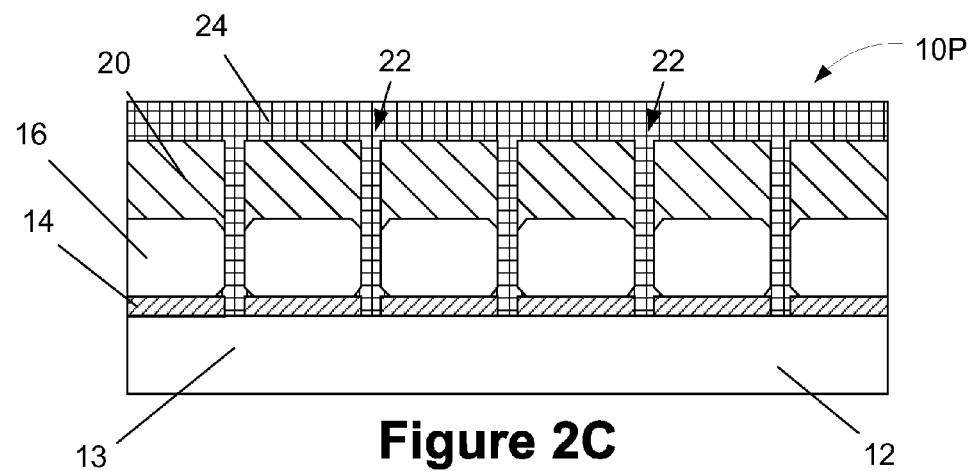

FIG. 2C depicts the device after an appropriate amount of a masking material 24, e.g., polysilicon, silicon nitride, silicon dioxide or any material that has a high degree of etch selectivity to the materials used for the items 14, 16, 20 in the etching steps discussed below, etc., has been formed so as to overfill the openings 22 with the masking material 24. The manner in which such materials are formed are well known to those skilled in the art.

Figure 2D:
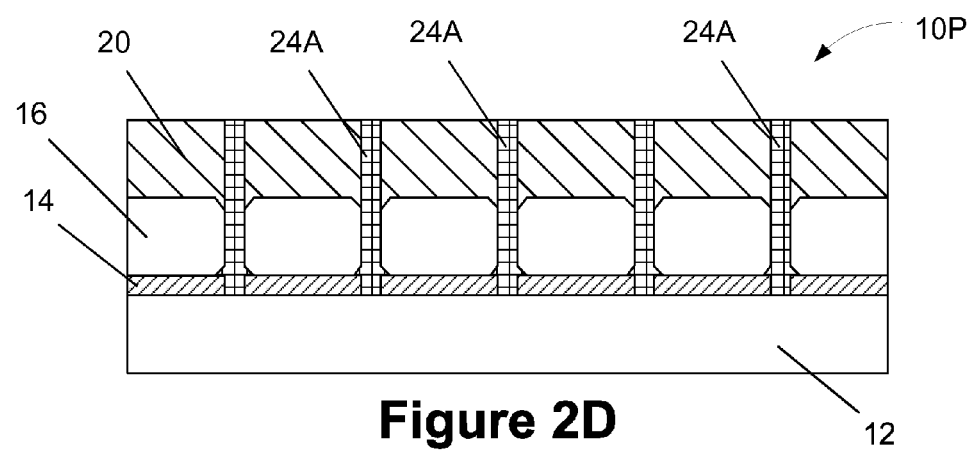

FIG. 2D depicts the device after at least one chemical mechanical polishing (CMP) process has been performed to remove excess amounts of the masking material 24 positioned outside of the openings 22 to thereby define a plurality of initial masking structures 24A positioned in the openings 22.

Figure 2E:
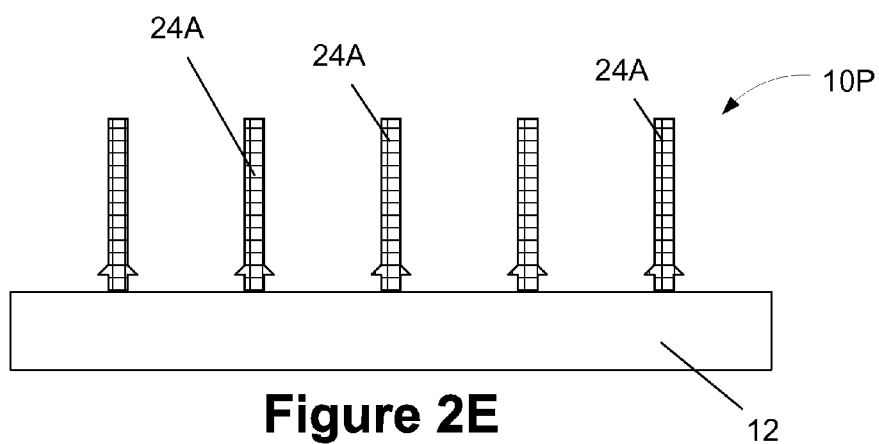

Next, as shown in FIG. 2E, one or more etching processes are performed to remove the sacrificial layer of material 20, the nucleation layer 16 and the remaining portions of the seed layer 14. In one example, the etching processes may be dry anisotropic etching processes. The etching process(es) leaves the initial masking structures 24A positioned above the structure or layer of material 12. In some embodiments, if desired, the initial masking structures 24A may be used as a masking layer as it relates to performing any of a variety of different activities, e.g., etching, ion implantation, on the structure or layer of material 12.

Figure 2F:
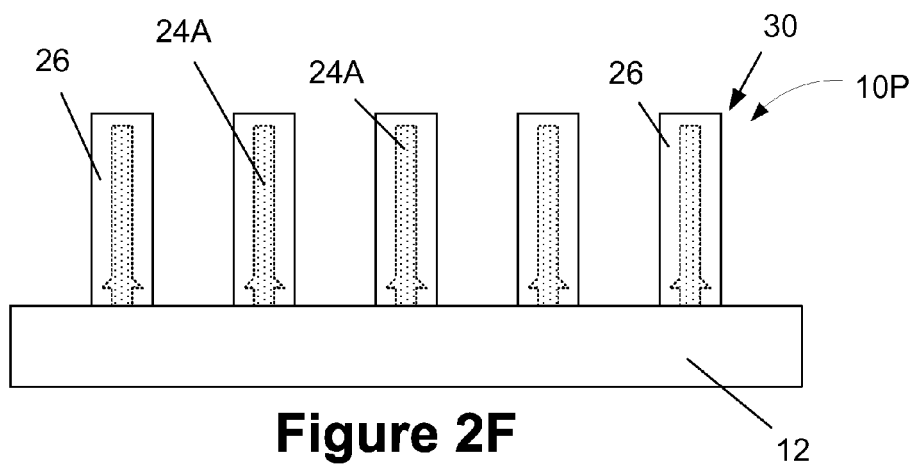

FIG. 2F depicts a further embodiment wherein an optional, selective deposition process was performed to form additional masking material 26 on the initial masking structures 24A to thereby result in a plurality of final masking features 30. Such an operation would be performed if the initial masking structures 24A were too small for the intended application. The plurality of final masking materials constitutes one illustrative embodiment of a positive masking layer 10P that may be manufactured using the methods described herein. The additional masking material 26 may be comprised of a variety of different materials, e.g., a metal or metal alloy, polysilicon, a semiconductor material, a dielectric insulating material, etc. The additional masking material 26 may be formed by performing a variety of known techniques, e.g., CVD (PECVD or MOCVD), ALD, etc. The quantity of the additional masking material 26 formed on the initial masking structures 24A may vary depending upon the particular application, and the additional masking material 26 may be formed as a means of controlling or establishing the final desired size or critical dimension of the final masking features.

Figure 2G:
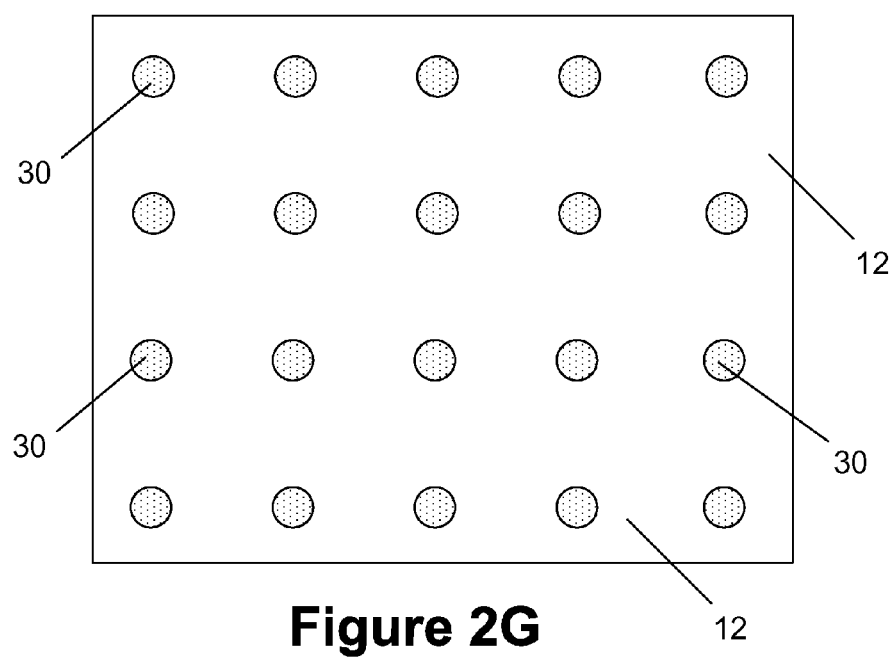

FIG. 2G is a plan view depicting one illustrative pattern in which the final masking structures 30 may be formed using the methods described herein.

Figure 2H:
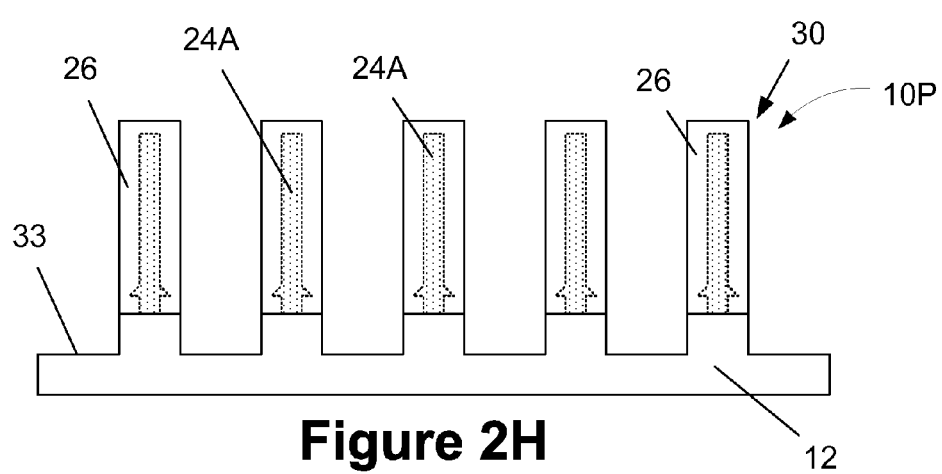

In FIG. 2H, one or more etching processes have been performed through the positive masking layer 10P (depicted in FIG. 2E) on the structure or layer of material 12 to thereby define a plurality of illustrative recesses 33 in the structure or layer of material 12. Of course, the positive masking layer 10P may be used to form through-hole type openings that extend entirely through the structure or layer of material 12. As noted above, the illustrative masking layer 10P may be used for performing other process operations on the structure or layer of material 12.

Figure 3A:
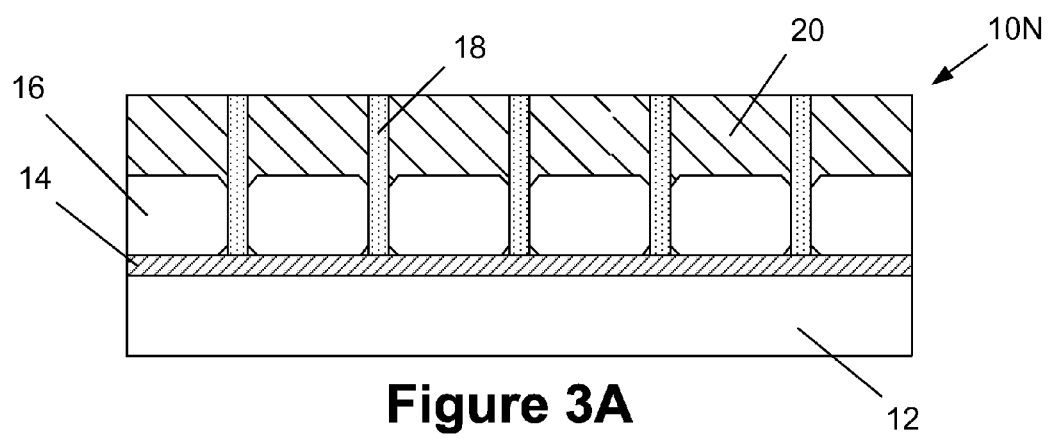
FIGS. 3A-3G depict yet another illustrative example where the methods disclosed herein may be employed to form a negative masking layer.

FIGS. 3A-3G depict yet another illustrative example where the methods disclosed herein may be employed to form a negative masking layer 10N for use in manufacturing integrated circuit products. FIG. 3A depicts the device at a point of fabrication that corresponds to that shown in FIG. 2A, i.e., after the alloy structures 18 have been formed and after the sacrificial layer of material 20 has been formed.

Figure 3B:
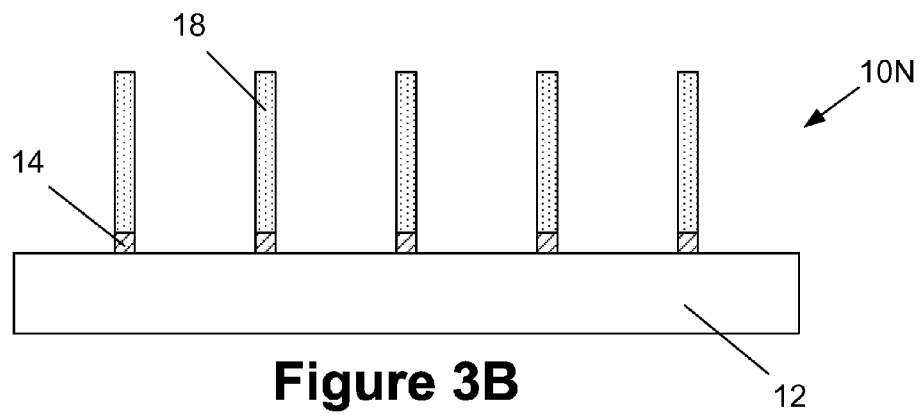

FIG. 3B depicts the device after one or more etching processes have been performed to remove the sacrificial layer of material 20, the nucleation layer 16 and to pattern the seed layer 14. Such etching processes are performed using etch chemistries that allow selective removal of material relative to the alloy structures 18.

Figure 3C:
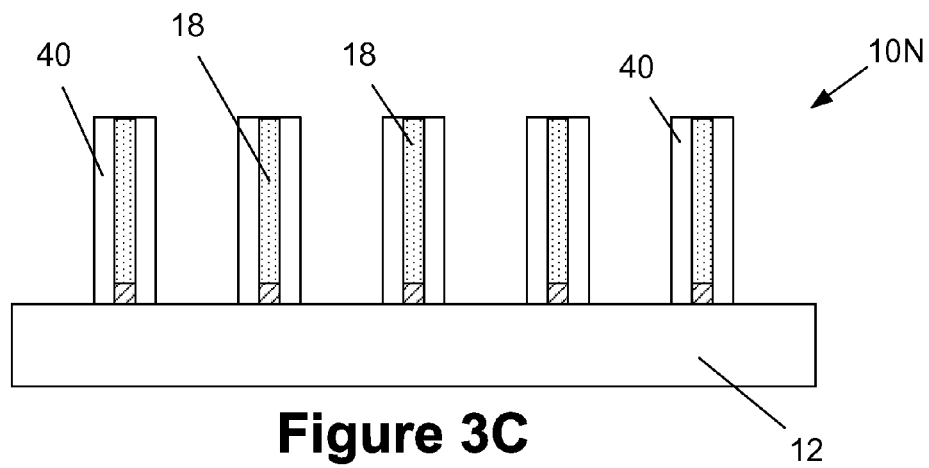

In FIG. 3C, illustrative spacers 40 have been formed around the perimeter of the alloy structures 18. The spacers 40 may be comprised of a variety of insulating materials such as, for example, silicon dioxide, silicon nitride, a low-k (k value less than about 3.3) insulating material, etc. The spacers 40 may be formed by performing a conformal deposition process, e.g., CVD, ALD, etc., and thereafter performing an anisotropic etching process on the layer of spacer material to thereby result in the spacers 40 positioned around the perimeter of the alloy structures 18. The width of the spacers 40 may vary depending upon the particular application. The size of the spacers 40 formed on the alloy structures 18 will be used to set the size of the openings formed in the negative masking layer 10N, as described more fully below.

Figure 3D:
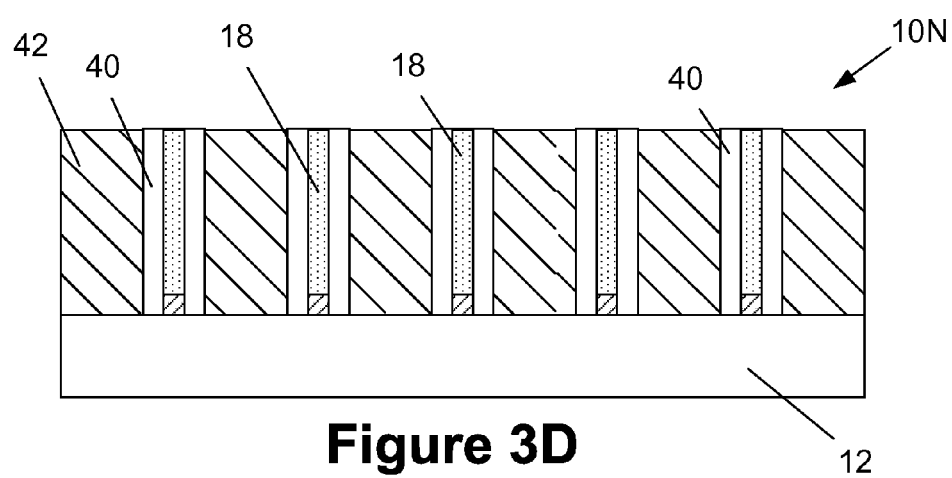

Next, as shown in FIG. 3D, a layer of masking material 42 has been formed above the structure depicted in FIG. 3C, and a planarization process, such as a chemical mechanical planarization (CMP) process or an etch-back process, has been performed on the layer of masking material 42 to arrive at the structure depicted in FIG. 3D. The layer of masking material 42 may be comprised of a variety of materials such as, for example, silicon dioxide, silicon nitride, a photoresist material, carbon, polysilicon, amorphous silicon, etc., it may be formed using any traditional process, e.g., CVD, ALD, etc., and it may be formed to any desired thickness.

Figure 3E:
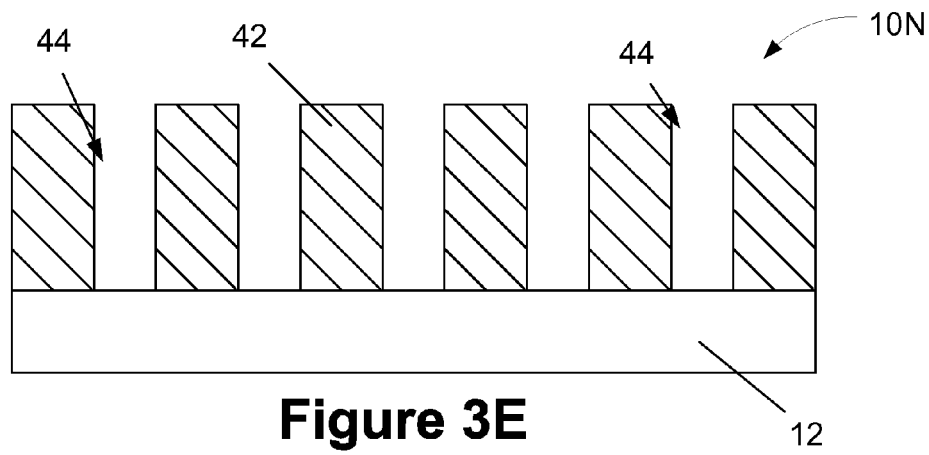

Next, as shown in FIG. 3E, one or more etching processes are performed to remove the alloy structures 18 and the spacers 40 selectively relative to the layer of masking material 42. In one example, the etching processes may be dry anisotropic etching processes. The etching process(es) results in the formation of a plurality of openings 44 in the negative masking layer 10N.

Figure 3F:
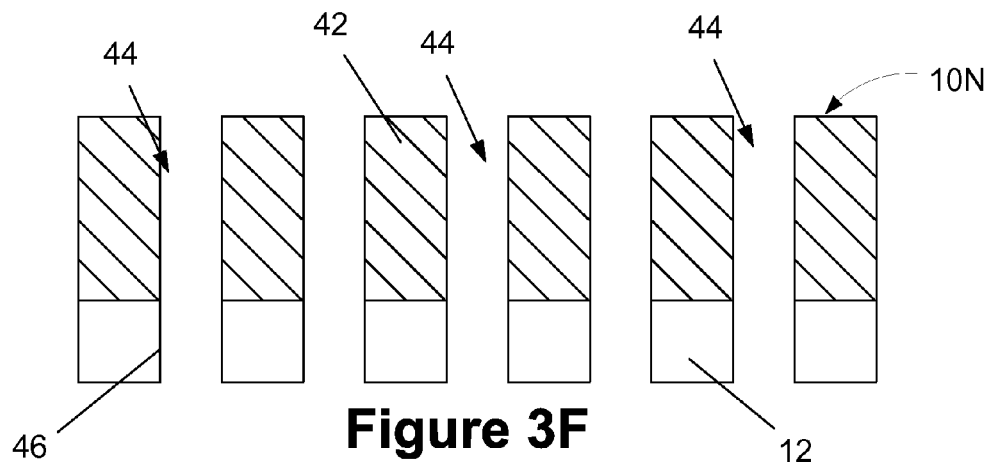

FIG. 3F depicts the device after one or more etching processes have been performed through the negative masking layer 10N (depicted in FIG. 3E) on the structure or layer of material 12 to thereby define a plurality of illustrative through-hole openings 46 in the structure or layer of material 12. Of course, the negative masking layer 10N may be used to form recesses that extend only partially through the structure or layer of material 12. As noted above, the illustrative masking layer 10N may be used for performing other process operations on the structure or layer of material 12.

Figure 3G:
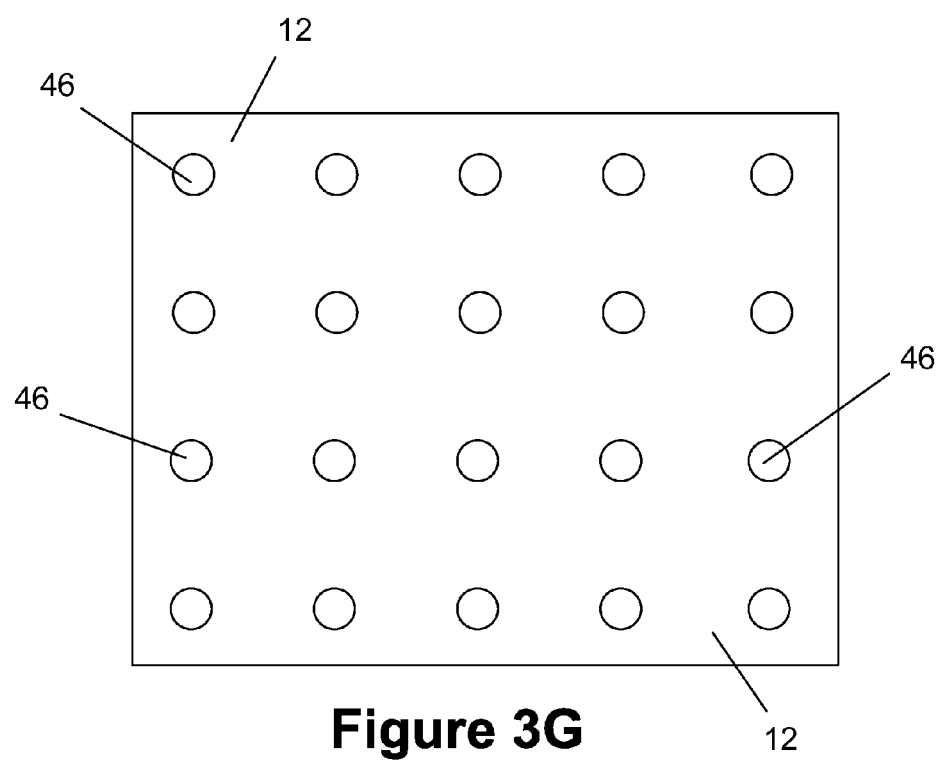

FIG. 3G is a plan view depicting one illustrative pattern in which the illustrative opening 46 may be formed in the structure or layer of material 12 using the methods described herein. As will be appreciated by those skilled in the art after a complete reading of the present application, FIGS. 3A-3G depict another example where the methods disclosed herein may be employed to form an arrangement of openings 46 without the use of photolithographic tools or techniques.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
forming a seed layer above a structure, said seed layer being comprised of a metal-containing material;
forming a nucleation layer on said seed layer, said nucleation layer comprising a transition metal oxide ceramic material;
performing at least one thermal treatment process at a temperature so as to generate a plurality of spaced-apart, vertically oriented alloy structures, wherein said alloy structures are comprised of at least one material from said seed layer and at least one material from said nucleation layers;
after forming said alloy structures, forming a sacrificial material layer above said nucleation layer and around said alloy structures;
performing at least one etching process to remove said alloy structures and portions of said seed layer so as to thereby define a plurality of openings;
forming an initial masking structure in each of said openings;
performing at least one etching process to remove said sacrificial material layer and said nucleation layer so as to thereby expose said structure and define a masking layer comprised of at least said initial masking structures; and
performing at least one process operation on said structure through said masking layer.

2. The method of claim 1, wherein said seed layer is comprised of one of the following materials: platinum, copper or aluminum.

3. The method of claim 1, wherein said nucleation layer is comprised of a strontium, bismuth, tantalum, or niobium containing material.

4. The method of claim 1, wherein performing said at least one thermal treatment process comprises performing a first thermal treatment process at a temperature that falls within the range of about 600-850° C. in an oxygen-containing ambient.

5. The method of claim 4, wherein a temperature ramp rate during said first thermal treatment process falls within a range of about 10-80° C./sec.

6. The method of claim 4, further comprising performing a second thermal treatment process at a temperature that falls within the range of about 230-430° C. in a hydrogen-containing ambient.

7. The method of claim 1, wherein performing said at least one process operation comprises performing at least one etching process.

8. The method of claim 1, wherein said sacrificial material layer is comprised of silicon dioxide, silicon nitride or polysilicon.

9. The method of claim 1, wherein said structure is a layer of material.

10. A method, comprising:
forming a seed layer above a structure, said seed layer being comprised of a metal-containing material;
forming a nucleation layer on said seed layer, said nucleation layer comprising a transition metal oxide ceramic material;
performing at least one thermal treatment process at a temperature so as to generate a plurality of spaced-apart, vertically oriented alloy structures, wherein said alloy structures are comprised of at least one material from said seed layer and at least one material from said nucleation layer;
after forming said alloy structures, forming a sacrificial material layer above said nucleation layer and around said alloy structures;
performing at least one etching process to remove said alloy structures and portions of said seed layer so as to thereby define a plurality of openings;
forming an initial masking structure in each of said openings;
performing at least one etching process to remove said sacrificial material layer and said nucleation layer so as to thereby expose said structure and said initial masking structures;
forming additional masking material selectively on said initial masking structures so as to thereby define a plurality of final masking structures, wherein said final masking structures define a masking layer; and
performing at least one process operation on said structure through said masking layer.

11. The method of claim 10, wherein said seed layer is comprised of one of the following materials: platinum, copper or aluminum.

12. The method of claim 10, wherein said nucleation layer is comprised of a strontium, bismuth, tantalum, or niobium containing material.

13. The method of claim 10, wherein performing said at least one thermal treatment process comprises performing a first thermal treatment process at a temperature that falls within the range of about 600-850° C. in an oxygen-containing ambient.

14. The method of claim 13, wherein a temperature ramp rate during said thermal treatment process falls within a range of about 10-80° C./sec.

15. The method of claim 13, further comprising performing a second thermal treatment process at a temperature that falls within the range of about 230-430° C. in a hydrogen-containing ambient.

16. A method, comprising:
forming a seed layer above a structure, said seed layer being comprised of one of the following materials: platinum, copper or aluminum;
forming a nucleation layer on said seed layer, said nucleation layer being comprised of a strontium, bismuth, tantalum, or niobium containing material;
performing a first thermal treatment process at a temperature so as to generate a plurality of spaced-apart, vertically oriented alloy structures, wherein said alloy structures are comprised of at least one material from said seed layer and at least one material from said nucleation layer and wherein said first thermal treatment process is performed at a temperature that falls within the range of about 600-850° C.;
after forming said alloy structures, forming a sacrificial material layer above said nucleation layer and around said alloy structures;
performing at least one etching process to remove said alloy structures and portions of said seed layer so as to thereby define a plurality of openings;
forming an initial masking structure in each of said openings;
performing at least one etching process to remove said sacrificial material layer and said nucleation layer so as to thereby expose said structure and said initial masking structures;

forming additional masking material selectively on said initial masking structures so as to thereby define a plurality of final masking structures, wherein said final masking structures define a masking layer; and performing at least one process operation on said structure through said masking layer.

17. The method of claim 16, wherein a temperature ramp rate during at least a portion of said thermal treatment process falls within a range of about 10-80° C./sec.

18. The method of claim 16, further comprising performing a second thermal treatment process at a temperature that falls within the range of about 230-430° C. in a hydrogen-containing ambient prior to forming said sacrificial material layer.

19. A method, comprising:

forming a seed layer above a structure, said seed layer being comprised of a metal-containing material;

forming a nucleation layer on said seed layer, said nucleation layer comprising a transition metal oxide ceramic material;

performing a first thermal treatment process at a temperature so as to generate a plurality of spaced-apart, vertically oriented alloy structures, wherein said alloy structures are comprised of at least one material from said seed layer and at least one material from said nucleation layer;

after forming said alloy structures, forming a sacrificial material layer above said nucleation layer and around said alloy structures;

performing at least one etching process to remove said sacrificial material layer and said nucleation layer and to pattern said seed layer so as to thereby expose said alloy structures and portions of said structure;

forming a spacer structure around each of said exposed alloy structures;

forming a layer of masking material around said spacer structures;

performing at least one etching process to remove said spacer structures, said alloy structure and said patterned seed layer so as to thereby define a masking layer comprised of a plurality of openings; and performing at least one process operation on said structure through said masking layer.

20. The method of claim 19, wherein said seed layer is comprised of one of the following materials: platinum, copper or aluminum.

21. The method of claim 19, wherein said nucleation layer is comprised of a strontium, bismuth, tantalum, or niobium containing material.

22. The method of claim 19, wherein said first thermal treatment process is performed at a temperature that falls within the range of about 600-850° C. in an oxygen-containing ambient prior to forming said sacrificial material layer.

23. The method of claim 22, wherein a temperature ramp rate during at least a portion of said first thermal treatment process falls within a range of about 10-80° C./sec.

24. The method of claim 22, further comprising performing a second thermal treatment process at a temperature that falls within the range of about 230-430° C. in a hydrogen-containing ambient.

25. A method, comprising:

forming a seed layer above a structure, said seed layer being comprised of one of the following materials: platinum, copper or aluminum;

forming a nucleation layer on said seed layer, said nucleation layer being comprised of a strontium, bismuth, tantalum, or niobium containing material;

performing a first thermal treatment process at a temperature so as to generate a plurality of spaced-apart, vertically oriented alloy structures, wherein said alloy structures are comprised of at least one material from said seed layer and at least one material from said nucleation layer and wherein said first thermal treatment process is performed at a temperature that falls within the range of about 600-850° C.;

after forming said alloy structures, forming a sacrificial material layer above said nucleation layer and around said alloy structures;

performing at least one etching process to remove said sacrificial material layer and said nucleation layer and to pattern said seed layer so as to thereby expose said alloy structures and portions of said structure;

forming a spacer structure around each of said exposed alloy structures;

forming a layer of masking material around said spacer structures;

performing at least one etching process to remove said spacer structures, said alloy structures and said patterned seed layer so as to thereby define a masking layer comprised of a plurality of openings; and performing at least one process operation on said structure through said masking layer.

26. The method of claim 25, wherein a temperature ramp rate during at least a portion of said first thermal treatment process falls within a range of about 10-80° C./sec.

27. The method of claim 25, further comprising performing a second thermal treatment process at a temperature that falls within the range of about 230-430° C. in a hydrogen-containing ambient prior to forming said sacrificial material layer.

\* \* \* \* \*